United States Patent
Park et al.

(10) Patent No.: US 6,225,818 B1
(45) Date of Patent: May 1, 2001

(54) INTEGRATED CIRCUITS INCLUDING FUNCTION IDENTIFICATION CIRCUITS HAVING OPERATING MODES THAT IDENTIFY CORRESPONDING FUNCTIONS OF THE INTEGRATED CIRCUITS

(75) Inventors: Cheol-hong Park, Seoul; Sang-seok Kang; Jae-hoon Joo, both of Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/304,030

(22) Filed: May 3, 1999

(30) Foreign Application Priority Data

May 4, 1998 (KR) .................................................. 98-15997

(51) Int. Cl.⁷ .......................... G01R 31/02; H01H 37/76
(52) U.S. Cl. .......................... 324/763; 324/764; 327/525
(58) Field of Search ................... 324/763, 764; 327/525

(56) References Cited

U.S. PATENT DOCUMENTS

| | | | |
|---|---|---|---|
| 3,587,052 | * 6/1971 | Metcalf | 340/825 |
| 4,480,199 | 10/1984 | Varshney et al. | 327/525 |
| 4,716,302 | * 12/1987 | Flannagan et al. | 327/546 |
| 4,942,358 | * 7/1990 | Davis et al. | 324/764 |
| 5,027,322 | * 6/1991 | Pribyl et al. | 365/189 |
| 5,103,166 | 4/1992 | Jeon et al. | 324/764 |
| 5,222,043 | * 6/1993 | Pribyl et al. | 365/189 |
| 5,301,143 | * 4/1994 | Ohri et al. | 365/96 |
| 5,347,263 | * 9/1994 | Carroll et al. | 340/10.4 |
| 5,459,355 | * 10/1995 | Kreifels | 257/758 |
| 5,553,022 | * 9/1996 | Weng et al. | 365/189 |
| 5,731,733 | * 3/1998 | Denham | 327/525 |
| 5,787,012 | * 7/1998 | Levitt | 716/1 |
| 5,789,970 | * 8/1998 | Denham | 327/525 |
| 5,825,214 | * 10/1998 | Klosa | 327/104 |

* cited by examiner

Primary Examiner—Safet Metjahic
Assistant Examiner—Wasseem H Hamdan
(74) Attorney, Agent, or Firm—Myers Bigel Sibley & Sajovec

(57) ABSTRACT

An integrated circuit includes first and second pads that are electrically connected to a circuit inside the integrated circuit. The circuit performs multiple functions which may be selected. A function identification circuit, inside the integrated circuit, is electrically connected to the first and second pads. The function identification circuit operates in multiple modes, wherein each operating mode corresponds to a function performed by the circuit. The function of the circuit may thereby be identified using fewer pads which may allow a reduction in the cost of the integrated circuit.

4 Claims, 4 Drawing Sheets

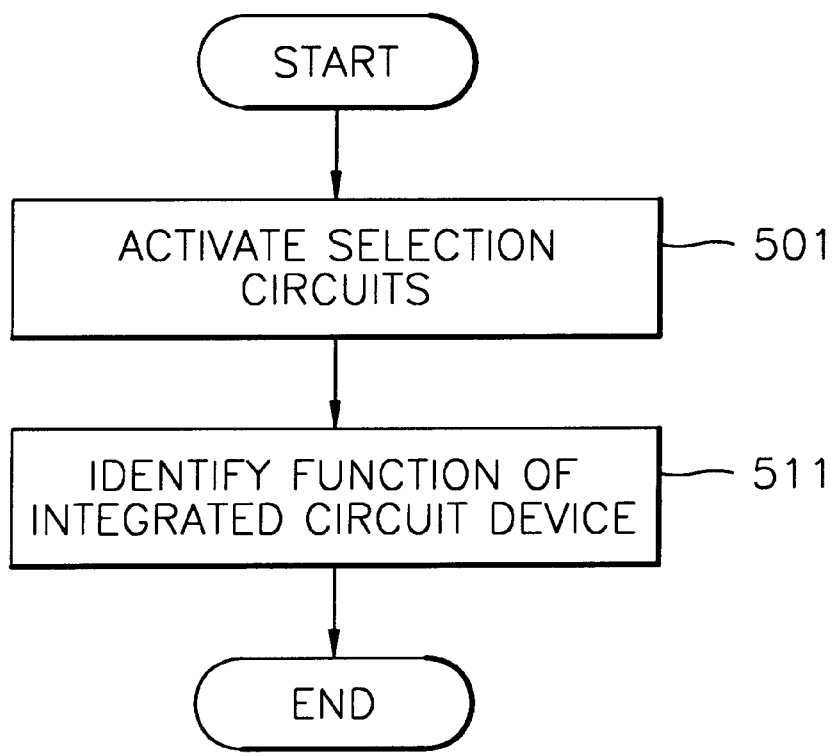

INTEGRATED CIRCUITS INCLUDING FUNCTION IDENTIFICATION CIRCUITS HAVING OPERATING MODES THAT IDENTIFY CORRESPONDING FUNCTIONS OF THE INTEGRATED CIRCUITS

FIELD OF THE INVENTION

The present invention relates to the field of integrated circuits in general and more particularly to the performance of multiple functions by integrated circuits.

BACKGROUND OF THE INVENTION

As the complexity of integrated circuits increases, so may the number of functions provided by the integrated circuits. The function provided by the integrated circuit may be selected and a label placed on the package of the integrated circuit to identify the function provided by the integrated circuit.

The function of the integrated circuit may later be identified by applying a voltage to the integrated circuit and observing the resulting current. U.S. Pat. No. 5,103,166 to Jeon et al. discusses identification circuitry including a voltage limiter which limits an input potential difference between a power supply terminal and an input terminal to a predetermined voltage. U.S. Pat. No. 4,480,199 to Varshney et al. discusses an identification circuit wherein, a single identification circuit may be electrically connected to a pad of the integrated circuit. As described above, a voltage may be applied to the pad, causing a current to flow which may be used to identify the function provided by the integrated circuit. As the number of functions provided by the integrated circuit increases, however, so may the number of required pads also increase, which may increase the cost and/or complexity of the integrated circuit. In view of the above, there continues to exist a need to further improve the identification of functions provided by integrated circuits.

SUMMARY OF THE INVENTION

It is therefore an object of the present invention to allow a reduction in the cost and/or complexity of integrated circuits including circuits with multiple functions.

It is another object of the present invention to allow a reduction in the number of pads that are used to identify the function of circuits.

These, and other objects, are provided by a function identification circuit that operates in a plurality of modes. The operating modes correspond to functions performed by a circuit in the integrated circuit. The function performed by the circuit can be identified by response to a series of voltage levels applied to the function identification circuit and observing the predetermined voltage at which current flows. The function which corresponds to the predetermined voltage at which current flows, is the function performed by the circuit. The function of the circuit may thereby be identified using fewer pads which may allow a reduction in the cost of the integrated circuit.

In particular, an integrated circuit according to the present invention includes first and seconds pads. A function identification circuit that operates in a plurality of modes is electrically connected to the first and second pads, wherein the plurality of operating modes correspond to the plurality of functions performed by the circuit.

In another aspect of the present invention, the function identification circuit includes a plurality of current circuits, that are electrically connected between the first and second pads. The current circuits conduct current when operating. A plurality of selection circuits are electrically connected to the plurality of current circuits, wherein the plurality of selection circuits select which of the plurality of current circuits operate. In one embodiment, the operating modes of function identification circuit are determined by fuses that are cut during a manufacturing process of the integrated circuit.

In another aspect of the present invention, the function identification circuit includes a first current circuit, including a first source node that is electrically connected to the first pad and a first gate/drain node. A second current circuit includes a second source node that is electrically connected to the first gate/drain node and a second gate/drain node. A third current circuit includes a third source node that is electrically connected to the second gate/drain node and a third gate/drain node. A fourth current circuit includes a fourth source node that is electrically connected to the third gate/drain node and a fourth gate/drain node that is electrically connected to the second pad.

A first selection circuit includes a first primary node that is electrically connected to the first gate/drain node and a first secondary node that is electrically connected to the second pad. A second selection circuit includes a second primary node that is electrically connected to the second gate/drain node and a second secondary node that is electrically connected to the second pad. A third selection circuit includes a third primary node that is electrically connected to the third gate/drain node and a third secondary node that is electrically connected to the second pad.

BRIEF DESCRIPTION OF THE DRAWINGS

FIG. 5 is a flowchart illustrating operations of a function identification circuit according to the present invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Each embodiment described and illustrated herein includes its complementary conductivity type embodiment as well.

Figure 1A:
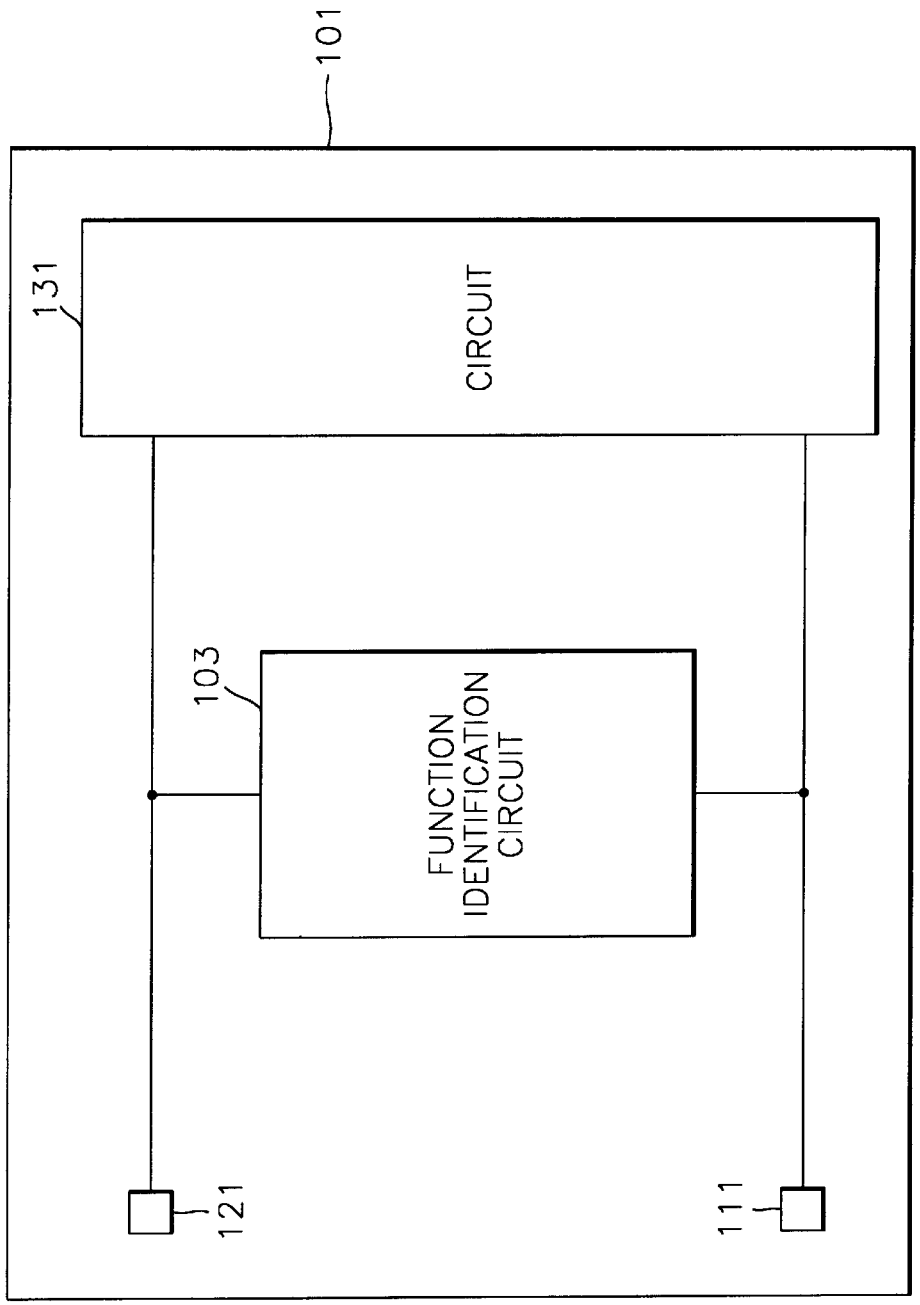
FIG. 1A is a block diagram of an integrated circuit including a function identification circuit according to the present invention.

FIG. 1A is a block diagram of an integrated circuit 101 including a function identification circuit 103 according to the present invention. According to FIG. 1A, the function identification circuit 103 is electrically connected between a first pad 111 and a second pad 121. The first and second pads 111, 121 provide input and/or output to/from the integrated circuit and the circuit 131.

The circuit 131 can perform a plurality of functions one of which may be selected. For example, the function of the circuit 131 may be selected by severing a fuse during a manufacturing process. The function identification circuit 103 operates in a plurality of modes which correspond to the plurality of functions performed by the circuit 131. Moreover, the operating modes of function identification circuit 103 are selected to correspond to the functions performed by the circuit 131. In particular, a series of predetermined voltages may be chosen, each of which corresponds to a function performed by the circuit 131. The predetermined voltages are applied between the first and second pads 111, 121 and the resulting current observed for each voltage applied. The predetermined voltage that results in current flow identifies the function performed by the circuit 131.

Figure 1B:
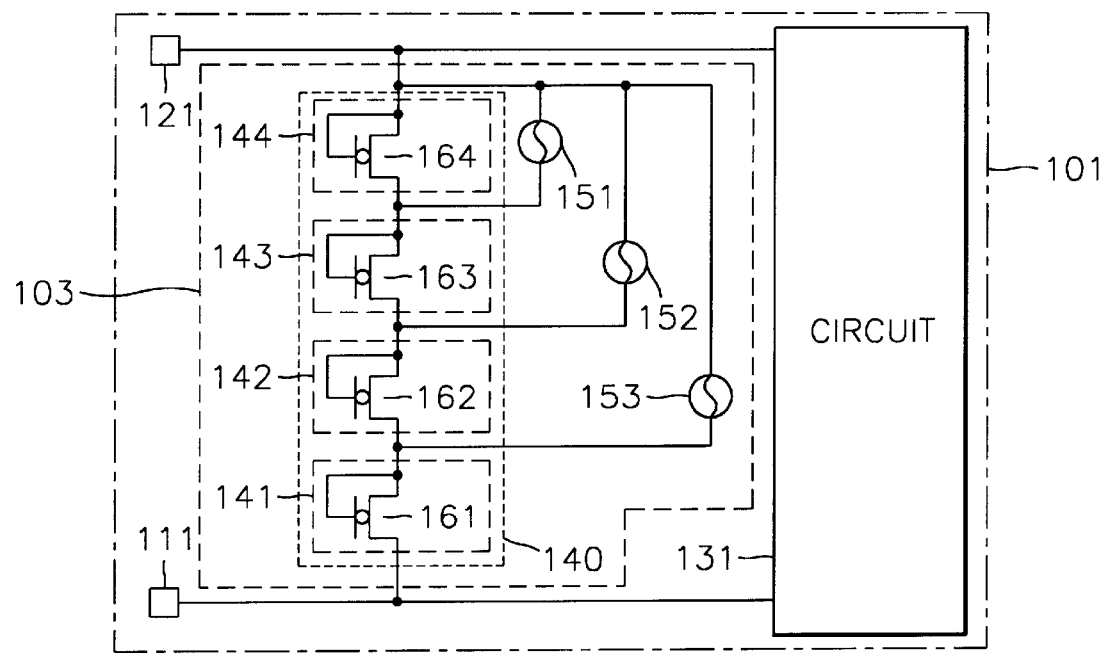
FIG. 1B is a schematic diagram of a first embodiment of a function identification circuit according to the present invention.

FIG. 1B is a schematic diagram of a first embodiment of a function identification circuit 103 according to the present invention. In particular, the function identification circuit 103 comprises a load circuit 140, including a plurality of current circuits 141–144, and a plurality selection circuits 151–153. The plurality of current circuits 141–144 are electrically connected in series between the first and second pads 111, 121. Each of the current circuits 141–144 functions as a diode that is forward biased by applying a voltage difference across the anode and cathode of the diode. As shown in FIG. 1B, each current circuit can be a Field Effect Transistor (FET) 161–164 that includes a source node, a gate node, and a drain node, such as PMOS transistor, wherein the gate node and the drain node are electrically connected. Accordingly, the transistor functions as a diode as described above, wherein the gate/drain node corresponds to the cathode and the source node corresponds to the anode. Consequently, the transistor will conduct current if the voltage applied at the source node exceeds the voltage applied at the gate/drain node by a corresponding bias voltage.

The current circuits 141–144 are electrically connected in series between the first and second pads 111, 121. In particular, the source node of the first current circuit 141 is electrically connected to the first pad 111. The gate/drain node of the first current circuit 141 is electrically connected to the source node of the second current circuit 142. The gate/drain node of the second current circuit 142 is electrically connected to the source node of the third current circuit 143. The gate/drain node of the fourth current circuit is electrically connected to the second pad 121.

When a voltage difference is applied between the first and second pads 111, 121 a current will flow if the voltage at the first pad 111 exceeds the voltage at the second pad 121 by at least the sum of the voltage drops required to forward bias each of the current circuits electrically connected between the first and second pads 111, 121. In addition, the voltage applied between the first and second pads 111, 121 may be in excess of the power supply voltage for the integrated circuit 101. For exemplary purposes, the forward bias voltage for the current circuits described herein is equal to about 0.7 Volts (V) and the power supply voltage is equal to about 3.3V.

The plurality of selection circuits 151–153 are electrically connected to the plurality of current circuits 141–144 and select which of the plurality of current circuits 141–144 is electrically connected between the first and second pads 111, 121. In particular, each selection circuit includes a primary node and a secondary node. When the selection circuit is activated, current may flow between the primary and secondary nodes. If the selection circuit is deactivated, no current will flow between the primary and secondary nodes. The selection circuit can be a fuse that is severed to deactivate the selection circuit or left intact to activate the selection circuit.

A primary node of the first selection circuit 153 is electrically connected to gate/drain node of the first current circuit 141. A secondary node of the first selection circuit 153 is electrically connected to the second pad 121. A primary node of the second selection circuit 152 is electrically connected to gate/drain node of the second current circuit 142 and a secondary node of the second selection circuit 152 is electrically connected to the second pad 121. A primary node of the third selection circuit 151 is electrically connected to the gate/drain node of the third current circuit 144 and a secondary node of the third current circuit 144 is electrically connected to the second pad 121.

According to FIG. 1B, the function identification circuit 103 operates in four modes. In a first mode of operation, the first selection circuit 153 is activated. Consequently, if the voltage applied between the first and second pads 111, 121 exceeds about 4.0V, current will flow from the first pad 111 through the first current circuit 141, through the first selection circuit 153 to the second pad 121. The function performed by the circuit 131 may thereby be identified.

In a second mode of operation, the second selection circuit 152 is activated and the first selection circuit 153 is deactivated. Consequently, if the voltage applied between the first and second pads 111, 121 exceeds about 4.7V, current will flow from the first pad 111 through the first and second current circuits 141, 142, through the second selection circuit 152 to the second pad 121. The function performed by the circuit 131 may thereby be identified.

In a third mode of operation, the third selection circuit 151 is activated and the first and second selection circuits 153, 152 are deactivated. Consequently, if the voltage applied between the first and second pads 111, 121 exceeds about 5.4V, current will flow from the first pad 111 through the first, second, and third current circuits 141–143, through the third selection circuit 151 to the second pad 121. The function performed by the circuit 131 may thereby be identified.

In a fourth mode of operation, the first through fourth selection circuits 151–153 are deactivated. Consequently, if the voltage applied between the first and second pads 111, 121 exceeds about 6.1V, current will flow from the first pad 111 through the first through the fourth current circuits 141–144, to the second pad 121. The function performed by the circuit 131 may thereby be identified.

Alternately, the identification circuit 103 may provide the same operating modes described above if the third selection circuit 151 is electrically connected in parallel with the third current circuit 143, and if the second selection circuit 152 is electrically connected in parallel with the second and third current circuits 142, 143, and the first selection circuit 153 is electrically connected in parallel with the first through the third current circuits 141–143. The term parallel as used herein includes an electrical connection wherein the primary node of the selection circuit is electrically connected to the source node of the corresponding current circuit and the secondary node of the selection circuit is electrically connected to the gate/drain node of the current circuit.

Figure 2:
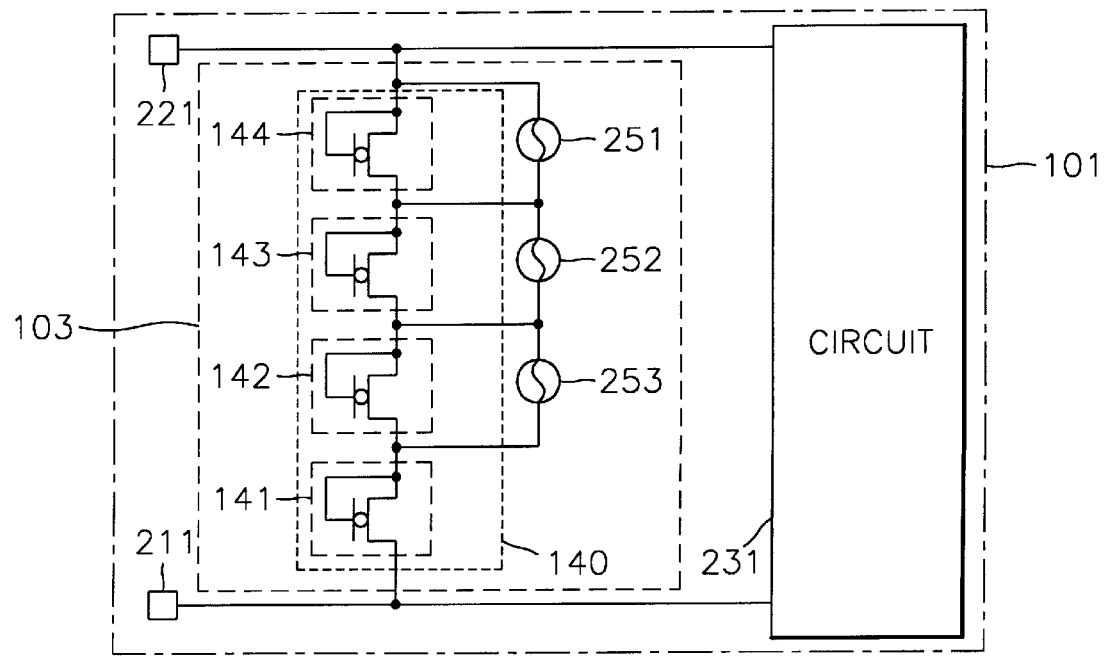
FIG. 2 is a schematic diagram of a second embodiment of a function identification circuit according to the present invention.

FIG. 2 is a schematic diagram of a second embodiment of a function identification circuit 103 according to the present invention. According to FIG. 2, the first through the fourth current circuits 141–144 are electrically connected in series between the first and second pads 111, 121 as described above.

A primary node of a first selection circuit 253 is electrically connected to a gate/drain node of the first current circuit 141 and a secondary node of the first selection circuit 253 is electrically connected to the gate/drain node of the second current circuit 142. A primary node of a second selection circuit 252 is electrically connected to the gate/drain node of the second current circuit 142 and a secondary node of the second selection circuit 252 is electrically connected to the drain/gate node of the third current circuit 143. A primary node of a third selection circuit 251 is electrically connected to the gate/drain node of the third current circuit 143 and a secondary node of the third selection circuit 251 is electrically connected to the second pad 121.

As shown in FIG. 2, the function identification circuit 103 operates in four modes. In a first mode of operation, the first selection circuit 253 is activated and the second and third selection circuits are deactivated. Consequently, if the voltage applied between the first and second pads 111, 121 exceeds about 5.4V, current will flow from the first pad 111 through the first current circuit 141, through the first selection circuit 253, through the third and fourth current circuits 143, 144 to the second pad 121. The function performed by the circuit 131 may thereby be identified.

In a second mode, the first and second selection circuits 253, 252 are activated and the third selection circuit 251 is deactivated. Consequently, if the voltage applied between the first and second pads 111, 121 exceeds about 4.7V, current will flow from the first pad 111 through the first current circuit 141, through the first and second selection circuits 253, 252, through fourth current circuit 144 to the second pad 121. The function performed by the circuit 131 may thereby be identified.

In a third mode, the first through the third selection circuits are activated. Consequently, if the voltage applied between the first and second pads 111, 121 exceeds about 4.0V, current will flow from the first pad 111 through the first current circuit 141, through the first through the third selection circuits 253–251 to the second pad 121. The function performed by the circuit 131 may thereby be identified.

In a fourth mode, the first through the third selection circuits 253–251 are deactivated. Consequently, if the voltage applied between the first and second pads 111, 121 exceeds about 6.1V, current will flow from the first pad 111 through the first through the fourth current circuits 141–144 to the second pad 121. The function performed by the circuit 131 may thereby be identified.

Figure 3:
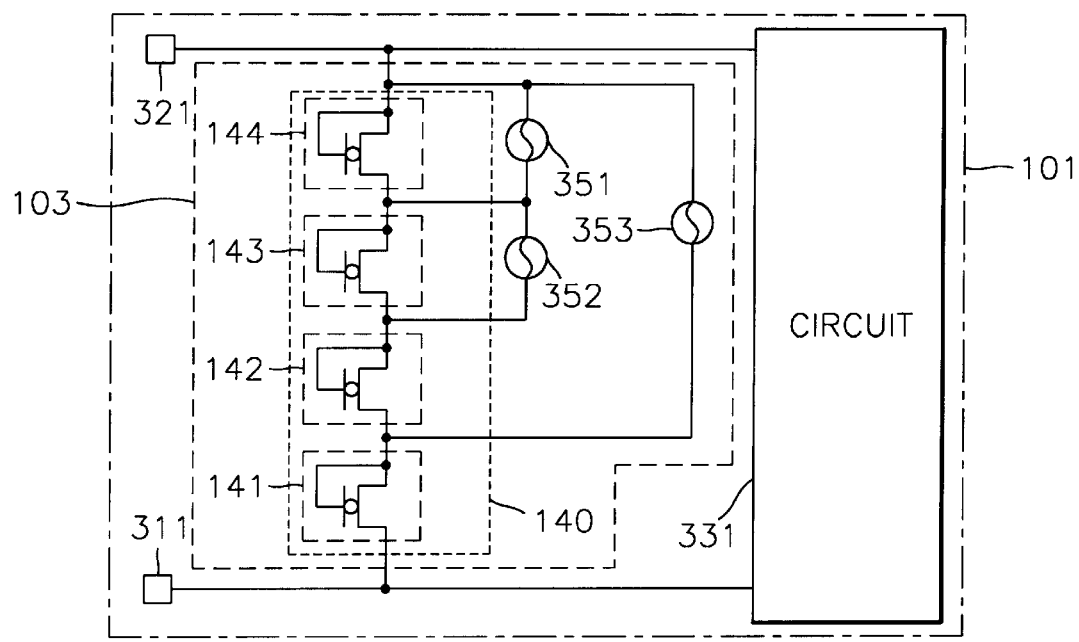
FIG. 3 is a schematic diagram of a third embodiment of a function identification circuit according to the present invention.

FIG. 3 is a schematic diagram of a third embodiment of a function identification circuit 103 according to the present invention. According to FIG. 3, the first through the fourth current circuits 141–144 are electrically connected in series between the first and second pads 111, 121 as described above.

A primary node of a first selection circuit 353 is electrically connected to the gate/drain node of the first current circuit 144 and a secondary node of the first selection circuit 353 is electrically connected to the second pad 121. A primary node of a second selection circuit 352 is electrically connected to gate/drain node of the second current circuit 142 and a secondary node of the second selection circuit 352 is electrically connected to the gate/drain node of the third current circuit 143. A primary node of a third selection circuit 351 is electrically connected to gate/drain node of the third current circuit 143 and a secondary node of the third selection circuit 351 is electrically connected to the second pad 121.

As shown in FIG. 3, the function identification circuit 103 operates in four modes. In a first mode of operation, the first selection circuit 353 is activated. Consequently, if the voltage applied between the first and second pads 111, 121 exceeds about 4.0V, current will flow from the first pad 111 through the first current circuit 141, through the first selection circuit 353 to the second pad 121. The function performed by the circuit 131 may thereby be identified.

In a second mode of operation, the second selection circuit 352 is activated and the first and third selection circuits 353, 351 are deactivated. Consequently, if the voltage applied between the first and second pads 111, 121 exceeds about 5.4V, current will flow from the first pad 111 through the first and second current circuits 141, 142, through the second selection circuit 352, through the fourth current circuit 144 to the second pad 121. Alternately, the third selection circuit 351 may be activated and the second selection deactivated to provide the same mode of operation described above. The function performed by the circuit 131 may thereby be identified.

In a third mode of operation, all of the selection circuits 353–351 are deactivated. Consequently, if the voltage applied between the first and second pads 111, 121 exceeds about 6.1V, current will flow from the first pad 111 through the first through the fourth current circuits 141–144 to the second pad 121. The function performed by the circuit 131 may thereby be identified.

In a fourth mode of operation, the second and third selection circuits 352, 351 are activated and the first selection circuit 353 is deactivated. Consequently, if the voltage applied between the first and second pads 111, 121 exceeds about 4.7V, current will flow from the first pad 111 through the first and second current circuits 141, 142, through the second and third selection circuits 352, 351 to the second pad 121. The function performed by the circuit 131 may thereby be identified.

The identification circuit 103 may provide the same operating modes described above if the first selection circuit 353 is electrically connected in parallel with the second through the fourth current circuits 142–144, and the second selection circuit 352 is electrically connected in parallel with the second current circuit 142, and the third selection circuit 351 is electrically connected in parallel with the third current circuit 143.

The identification circuit 103 may also provide the same operating modes described above if the first selection circuit 353 is electrically connected in parallel with the second through the fourth current circuits 142–144, and the second selection circuit 352 is electrically connected in parallel with the first current circuit 141, and the third selection circuit 351 is electrically connected in parallel with the second current circuit 142.

Furthermore, the identification circuit 103 may provide the same operating modes described above if the first selection circuit 353 is electrically connected in parallel with the first through the third current circuits 141–143, and the second selection circuit 352 is electrically connected in parallel with the first current circuit 141, and the third selection circuit 351 is electrically connected in parallel with the second current circuit 142.

Figure 4:
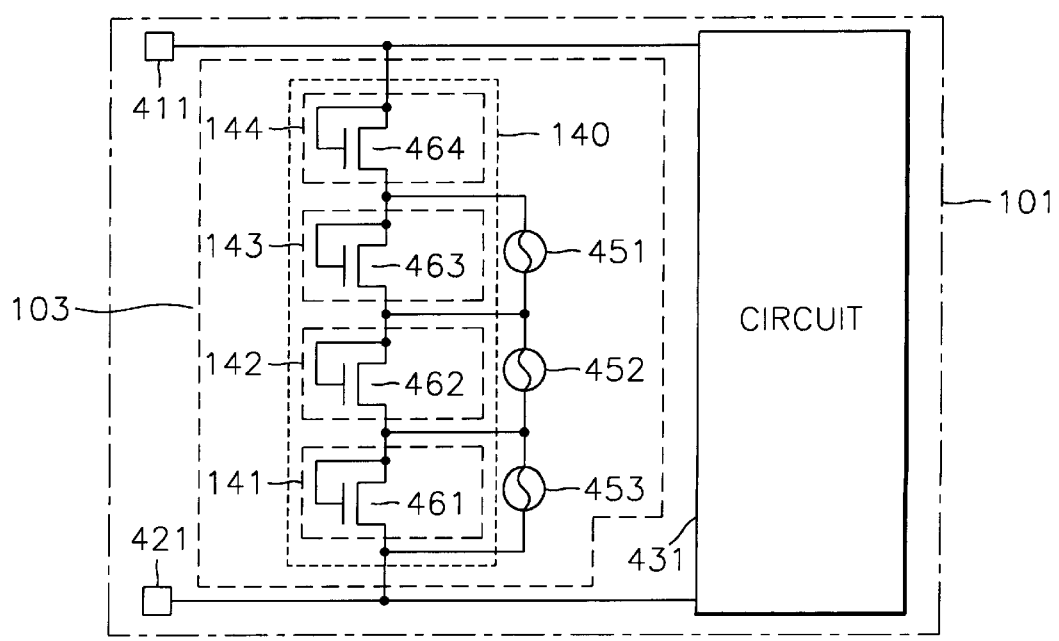
FIG. 4 is a schematic diagram of a fourth embodiment of a function identification circuit according to the present invention.

FIG. 4 is a schematic diagram of a fourth embodiment of a function identification circuit 103 according to the present invention. According to FIG. 4, the first through the fourth current circuits 141–144 are electrically connected in series between the first and second pads 111, 121 as described above and may be NMOS transistors 461–464.

According to FIG. 4, a primary node of a first selection circuit 453 is electrically connected to the first pad 111 and a secondary node of the first selection circuit 453 is electrically connected to the gate/drain node of the first current circuit 144. A primary node of a second selection circuit 452 is electrically connected to the gate/drain node of first current circuit 141 and a secondary node of the second selection circuit 452 is electrically connected to the gate/drain node of the second current circuit 142. A primary node of a third selection circuit 451 is electrically connected to the gate/drain node of second current circuit 142 and a secondary node of the second selection circuit 451 is electrically connected to the gate/drain node of the third current circuit 143.

As shown in FIG. 4, the function identification circuit 103 operates in four modes. In particular, the four operating modes associated with the embodiment in FIG. 4 are analogous to the operating modes described above in conjunction with FIG. 2.

FIG. 5 is a flowchart illustrating operations of a function identification circuit according to the present invention. During a manufacturing process, a number of selection circuits, described herein, may be activated to identify the function performed by the circuit 131 (Block 501). The activated selection circuits may reduce the voltage difference required between the first and second pads to cause a current to flow into the integrated circuit.

A series of predetermined voltages may be applied between the first and second pads of the integrated circuit. A current flow may be detected as a result of one of the applied predetermined voltages. The applied predetermined voltage which causes the current flow may be used to determine which selection circuits are activated, thereby determining the function performed by the circuit (Block 511).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
a circuit that performs a plurality of functions,
a first pad,
a second pad;
a function identification circuit, electrically connected to the first and second pads, that operates in a plurality of modes, wherein the plurality of operating modes identified by response to a series of voltage levels applied to the function identification circuit, wherein the plurality of operating modes correspond to the plurality of functions performed by the circuit, the function identification circuit further identification circuit further comprising:
  a plurality of current circuits electrically connected in series between the first and second pads, that conduct current when operating, wherein the plurality of current circuits further comprise:
    a first field effect transistor, including a first source node that is electrically connected to the first pad and a first gate/drain node;
    a second field effect transistor, including a second source node that is electrically connected to the first gate/drain node and a second gate/drain node;
    a third field effect transistor, including a third source node that is electrically connected to the second gate/drain node and a third gate/drain node;
    a fourth field effect transistor, including a fourth source node that is electrically connected to the third gate/drain node and a fourth gate/drain node that is electrically connected to the second pad; and
  a plurality of selection circuits, electrically connected in parallel across the plurality of current circuits, wherein the plurality of selection circuits select which of the plurality of current circuits operate, wherein the plurality of selection circuits further comprise:
    a first selection circuit, including a first primary node that is electrically connected to the first gate/drain node and a first secondary node that is electrically connected to the second pad;
    a second selection circuit, including a second primary node that is electrically connected to the second gate/drain node and a second secondary node that is electrically connected to the second pad; and
    a third selection circuit, including a third primary node that is electrically connected to the third gate/drain node and a third secondary node that is electrically connected to the second pad.

2. An integrated circuit comprising:
a circuit that performs a plurality of functions,
a first pad,
a second pad;
a function identification circuit, electrically connected to the first and second pads, that operates in a plurality of modes, wherein the plurality of operating modes identified by response to a series of voltage levels applied to the function identification circuit, wherein the plurality of operating modes correspond to the plurality of functions performed by the circuit, the function identification circuit further identification circuit further comprising:
a plurality of current circuits electrically connected in series between the first and second pads, that conduct current when operating, wherein the plurality of current circuits further comprise:
  a first field effect transistor, including a first source node that is electrically connected to the first pad and a first gate/drain node;
  a second field effect transistor, including a second source-node that is electrically connected to the first gate/drain node and a second gate/drain node;
  a third field effect transistor, including a third source node that is electrically connected to the second gate/drain node and a third gate/drain node;
  a fourth field affect transistor, including a fourth source node that is electrically connected to the third gate/drain node and a fourth gate/drain node that is electrically connected to the second pad, and
    a plurality of selection circuits, electrically connected in parallel across the plurality of current circuits, wherein the plurality of selection circuits select which of the plurality of current circuits operate, wherein the plurality of selection circuits further comprise:

a first selection circuit, including a first primary node that is electrically connected to the first gate/drain node and a first secondary node that is electrically connected to the second gate/drain node;

a second selection circuit, including a second primary node that is electrically connected to the second gate/drain node and a second secondary node that is electrically connected to the third gate/drain node; and a third selection circuit, including a third primary node that is electrically connected to the third gate/drain node and a third secondary node that is electrically connected to the fourth gate/drain node.

3. An integrated circuit comprising:

a circuit that performs a plurality of functions, a first pad, a second pad;

a function identification circuit, electrically connected to the first and second pads, that operates in a plurality of modes, wherein the plurality of operating modes identified by response to a series of voltage levels applied to the function identification circuit, wherein the plurality of operating modes correspond to the plurality of functions performed by the circuit, the function identification circuit further identification circuit further comprising:

a plurality of current circuits electrically connected in series between the first and second pads, that conduct current when operating, wherein the plurality of current circuits further comprise:

a first field effect transistor, including a first source node that is electrically connected to the first pad and a first gate/drain node;

a second field effect transistor, including a second source node that is electrically connected to the first gate/drain node and a second gate/drain node;

a third field effect transistor, including a third source node that is electrically connected to the second gate/drain node and a third gate/drain node, a fourth field effect transistor, including a fourth source node that is electrically connected to the third gate/drain node and a fourth gate/drain node that is electrically connected to the second pad; and a plurality of selection circuits electrically connected in parallel across the plurality of current circuits, wherein the plurality of selection circuits select which of the plurality of current circuits operate, wherein the plurality of selection circuits further comprise:

a first selection circuit, including a first primary node that is electrically connected to the first gate/drain node and a first secondary node that is electrically connected to the second pad;

a second selection circuit, including a second primary node that is electrically connected to the second gate/drain node and a second secondary node that is electrically connected to the third gate/drain node; and a third selection circuit, including a third primary node that is electrically connected to the third gate/drain node and a third secondary node that is electrically connected to the second pad.

4. An integrated circuit comprising:

a circuit that performs a plurality of functions, a first pad, a second pad;

a function identification circuit, electrically connected to the first and second pads, that operates in a plurality of modes, wherein the plurality of operating modes identified by response to a series of voltage levels applied to the function identification circuit, wherein the plurality of operating modes correspond to the plurality of functions performed by the circuit, the function identification circuit further identification circuit further comprising:

a plurality of current circuits electrically connected in series between the first and second pads, that conduct current when operating, wherein the plurality of current circuits further comprise:

a first field effect transistor, including a first source node that is electrically connected to the first pad and a first gate/drain node, a second field effect transistor, including a second source node that is electrically connected to the first gate/drain node and a second gate/drain node, a third field effect transistor, including a third source node that is electrically connected to the second gate/drain node and a third gate/drain node;

a fourth field effect transistor, including a fourth source node that is electrically connected to the third gate/drain node and a fourth gate/drain node that is electrically connected to the second pad; and a plurality of selection circuits, electrically connected in parallel across the plurality of current circuits, wherein the plurality of selection circuits select which of the plurality of current circuits operate, wherein the plurality of selection circuits further comprise:

a first selection circuit, including a first primary node that is electrically connected to the first pad and a first secondary node that is electrically connected to the first gate/drain node;

a second selection circuit, including a second primary node that is electrically connected to the first gate/drain node and a second secondary node that is electrically second gate/drain node; and a third selection circuit, including a third primary node that is electrically connected to the second gate/drain node and a third secondary node that is electrically connected to the third gate/drain node.

* * * * *